(12) United States Patent
Lang et al.

(10) Patent No.: US 6,295,205 B1
(45) Date of Patent: Sep. 25, 2001

(54) EXPLOSION PROTECTION FOR SEMICONDUCTOR MODULES

(75) Inventors: Thomas Lang, Zürich; Hans-Rudolf Zeller, Birr, both of (CH)

(73) Assignee: Asea Brown Boveri AG, Baden (CH)

( * ) Notice: Subject to any disclaimer, the term of this patent is extended or adjusted under 35 U.S.C. 154(b) by 0 days.

(21) Appl. No.: 09/377,922

(22) Filed: Aug. 20, 1999

(30) Foreign Application Priority Data

Aug. 29, 1998 (DE) .............................................. 198 39 422

(51) Int. Cl.$^7$ ...................................................... H05K 7/00
(52) U.S. Cl. .......................... 361/735; 361/715; 361/783; 174/525
(58) Field of Search ..................... 361/735, 715, 361/783, 387, 417; 174/525; 357/79, 72, 81

(56) References Cited

U.S. PATENT DOCUMENTS

| 4,162,514 | * | 7/1979 | De Bruyne et al. ................... 361/2 |
| 4,399,452 | * | 8/1983 | Nakashima et al. ................... 357/74 |
| 4,855,705 | * | 8/1989 | Narancic et al. ..................... 337/246 |
| 5,397,745 | | 3/1995 | Ferla et al. ........................... 438/125 |

FOREIGN PATENT DOCUMENTS

| 26 61 120 | 5/1978 | (DE) . |
| 27 49 359 | 5/1979 | (DE) . |
| 30 32 133 | 3/1981 | (DE) . |
| 0 033 399 | 8/1981 | (DE) . |
| 35 15 662 | 11/1986 | (DE) . |
| 39 37 087 | 5/1991 | (DE) . |
| 0 088 923 | 9/1983 | (EP) . |
| 61-125143 | * | 6/1986 | (JP) . |
| 61-172042 | * | 8/1986 | (JP) . |
| 6-204359 | | 7/1994 | (JP) . |
| 8-97068 | * | 4/1996 | (JP) . |

OTHER PUBLICATIONS

IBM Technical Disclosure Bulletin, vol. 23, No. 11, 1 page, "Protective Layer for Multilayer Ceramic I/O Pins", Apr. 1981 (English Abstract only).

IBM Technical Disclosure Bulletin, vol. 20, No. 9, 1 page, "Hybrid Cloth for Making Low Alpha Laminates", Feb. 1978 (English Abstract only).

* cited by examiner

Primary Examiner—Jeffrey Gaffin
Assistant Examiner—Hung Bui
(74) Attorney, Agent, or Firm—Oblon, Spivak, McClelland, Maier & Neustadt, P.C.

(57) ABSTRACT

A high-power semiconductor module having a casing which encloses at least one semiconductor element has an explosion protection element. This explosion protection element is a protective sheath which surrounds at least a portion of the casing and traps fragments which are projected outward in the event of an explosion of the semiconductor element. This prevents people from being injured or adjacent modules from being damaged by such fragments.

14 Claims, 2 Drawing Sheets

EXPLOSION PROTECTION FOR SEMICONDUCTOR MODULES

BACKGROUND OF THE INVENTION

1. Field of the Invention

The present invention relates to the field of power electronics. It relates specifically to a high-power semiconductor module as claimed in the preamble of patent claim 1.

2. Discussion of Background

In present-day converters having very little stray inductance and no protection circuit, all the energy of an energy-storage capacitor discharges in a few microseconds in the event of a short circuit. In the process, currents in the region of several hundred kilo amperes and power levels in the region of 100 MW occur. A short circuit therefor often leads to an explosion, in which fragments of the semiconductor element and of the casing are projected outward like projectiles.

In the planning of modules, it is therefore necessary to consider the following aspects for an explosion situation: firstly, nobody must be injured. This is achieved by accommodating the modules in an area which must not be entered during operation.

Secondly, consequential damage to objects, in particular to adjacent modules and busbars, should be prevented. In general, this requirement is virtually impossible to achieve satisfactorily.

DE-A-30'32'133 discloses a high-power semiconductor module having a semiconductor element, two electrodes between which the semiconductor element is clamped, and an insulating casing which encloses the semiconductor element. This module has an explosion protection element in the form of a single-piece or multi-piece hollow cylinder composed of a soft, elastic silicone rubber, which is inserted into the insulating casing (which is manufactured from ceramic) such that it encloses the semiconductor element. Molten metal which is projected outward in the event of an explosion is intended to be trapped by the explosion protection element and its kinetic energy is intended to be absorbed as far as possible, in order to protect the ceramic casing and other adjacent elements of the module against being struck by hot metal. In order to ensure this, the explosion protection element must have a high capability to absorb kinetic energy and, furthermore, must be heat-resistant in order that it is not melted by the explosion itself.

A disadvantage of such a design appears to be that the original module is enlarged by the space required for the protection element. Furthermore, it cannot be used in combination with any desired casing shapes. In addition, the kinetic energy cannot be completely absorbed in all cases, so that shocks are transmitted through the protection element to the insulating casing. If the semiconductor module has a ceramic casing as is disclosed in this document, then the natural robustness of the insulating casing may be sufficient for explosion protection. However, if the insulating casing is manufactured from plastic, then residual energy levels can quite possibly lead to destruction of the insulating casing, and to the formation of new ejected projectiles.

DE-C-26'61'120 likewise discloses an explosion protection element, which, however, is arranged outside a module casing. The explosion protection element surrounds the casing with a gap in the radial direction, by which means a cavity is formed, which is intended to be used to reduce the pressure in the event of an explosion. To do this, the cavity must be considerably larger than the area enclosed by the casing. A disadvantage of this design is, once again, the increased space required.

SUMMARY OF THE INVENTION

Accordingly, one object of the invention is to provide a novel high-power semiconductor module having an explosion protection element which occupies a relatively small amount of space and offers sufficient protection against explosions, even in the case of casings made of plastic.

This object is achieved by a high-power semiconductor module having the features of patent claim 1.

According to the invention, the high-power semiconductor module has a preferably expandable or elastic protective sheath, which is arranged outside the casing and, thanks to its tensile strength, traps fragments which are projected outward, and absorbs their kinetic energy. In consequence, all the projectiles which may be produced, including fragments produced from the casing itself, are trapped. Since it is manufactured from an expandable material, the protective sheath can be fitted over the casing in a simple manner, so that production times are not significantly affected. The space required for the protective sheath is minimal, so that there is no necessity for specific matching of the module design, in particular of its size, to the protective sheath. A further advantage is that, in the event of damage, it is immediately possible to see clearly which module has been destroyed since a casing which is externally still intact does not give the impression of nonexistent functionality.

Since the protective sheath is located outside the casing and is thus separate from the semiconductor element, the material requirements that it needs to satisfy are less stringent than for the protection element known from DE-A-30'32'133. For example, heat resistance is not a primary requirement.

Further advantageous embodiments are disclosed in the dependent patent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
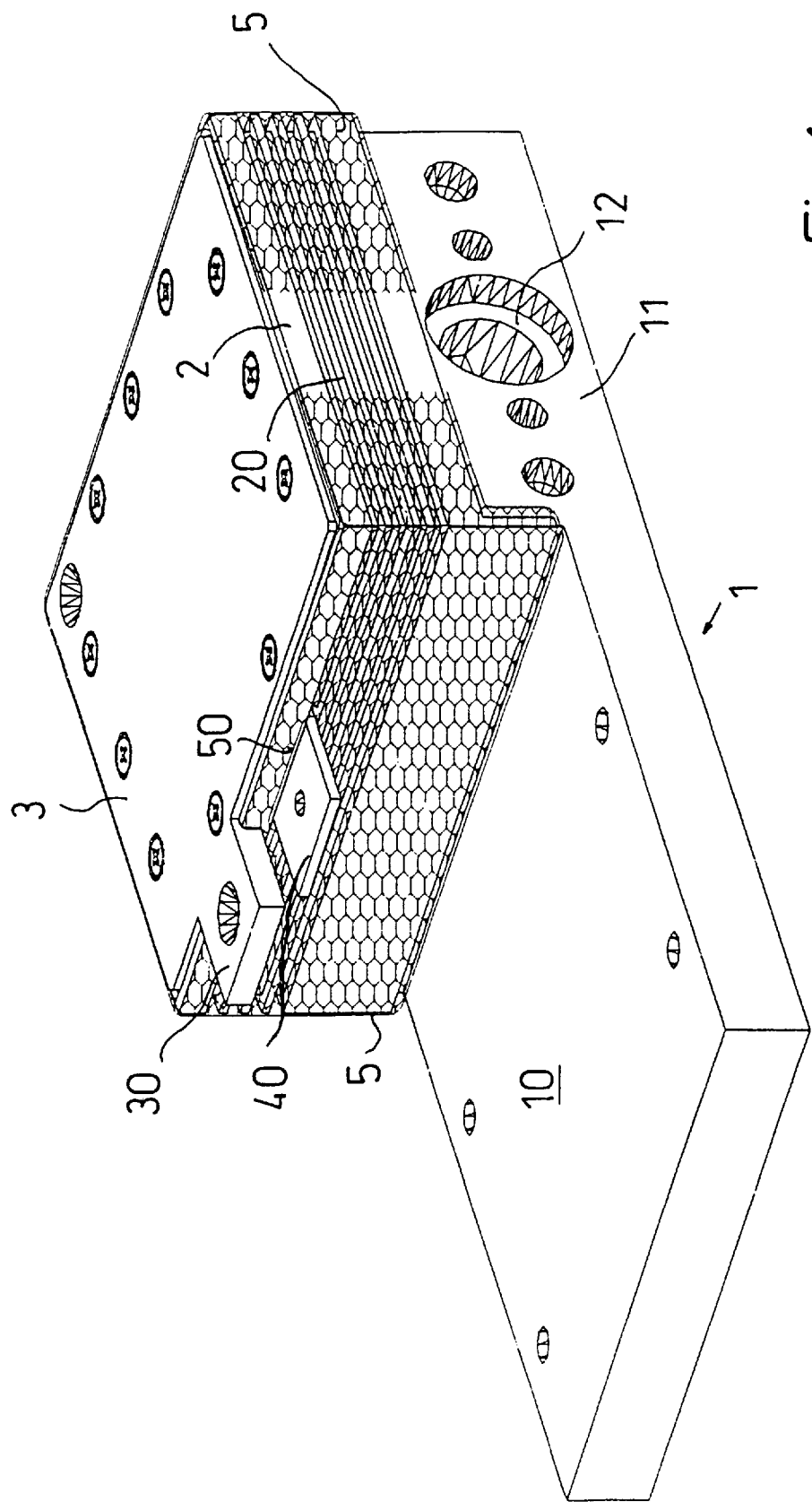
FIG. 1 shows a perspective illustration of a first embodiment of a high-power semiconductor module with the explosion protection according to the invention.

Referring now to the drawings, wherein like reference numerals designate identical or corresponding parts throughout the several views, FIG. 1 shows a first embodiment of a high-power semiconductor module which is provided with an explosion protection element according to the invention. Its design essentially corresponds to that of the known stackable "Press Pack" IGBT module (Insulated Gate Bipolar Transistor) from the applicant. The high-power semiconductor module according to the invention is, however, not limited to this form, but any desired housing shapes of high-power semiconductor modules can be provided with an explosion protection element according to the teaching of the invention.

The illustrated high-power semiconductor module has a first electrode plate in the form of a metallic mounting block 1, also called a substrate. This mounting block 1 is designed to be stepped, with a low step 10 merging into a high step 11. The low step 10 provides space for control electronics, which are not shown here. The high step 11 is provided with holes 12 for cooling water connections. Although this cannot be seen in the drawings, at least one semiconductor element as well as further components required for the functionality of the high-power semiconductor module are arranged on this high step 11. The semiconductor element is surrounded by a rectangular casing 2, to be more precise an insulating casing made of plastic, which has circumferential ribs 20 in the central region and, otherwise, has a smooth surface. The casing 2 is fitted on the high step 11 such that it surrounds it in a positively locking manner, and is drawn downward in the transitional region between the two steps 10, 11.

The upper opening of the casing 2, facing away from the mounting block 1, is closed by a metal cover plate 3 which can be screwed on and fits into the opening in a positively locking manner. This cover plate 3 is used as a second electrode plate, with a first tab which projects in the direction of the low step 10 being used as a cathode connection 30. Furthermore, a second tab, which forms a gate connection 40, passes through the casing 2.

According to the invention, the semiconductor module is surrounded by a protective sheath 5 wherein, in this example, it surrounds only the case 2. In FIG. 1, the protective sheath 5 is not shown continuously, in order that the casing 2 located underneath it remains visible. The protective sheath 5 is composed of a material having a high tensile strength, in order that it is not destroyed by the impact of fragments which are projected outward. It is designed to be expandable and is manufactured from a fabric. For example, it is possible to use Kevlar (aramid fibers made of para-phenylen-terephthalamide (PPTA) or other materials which are used for manufacturing bulletproof vests. FIG. 1 illustrates the protective sheath 5 with a large mesh, but this is intended only to make it easier to read the drawing. The fabric of the protective sheath 5 is preferably of sufficiently small mesh to prevent even small fragments from being able to pass through the mesh gaps.

The attachment of the protective sheath 5 to the module can be designed in widely differing ways and depends, in particular, on the shape of the module. In the example illustrated here, the protective sheath 5 is resting against the casing 2, is slightly expanded, and is thus held in its position only by its elasticity and without any other attachment aids. In this case, the protective sheath 5 can on the one hand be installed simply by fitting it in place, or can be laid in the form of a strip around the casing 2, subsequently being closed with a cohesive material joint or a force fit to form a ring. The protective sheath 5 is preferably designed like a flexible tube and integrally, if necessary with openings 50 for individual elements of the module being provided, for example for the gate connection 40. However, multi-piece versions and/or other forms can also be used.

In other embodiments which are not illustrated here, attachment means are provided, which attach the protective sheath to the module. In one embodiment, the protective sheath is attached to the mounting block and/or to the cover plate such that it forms a sheath which at least runs around the casing. This prevents fragments in the form of ricochets from being able to emerge from the protective sheath. In another embodiment, the protective sheath also at least partially surrounds the electrode plates.

In the example illustrated here, the protective sheath is arranged such that it rests against the casing. However, particularly when using attachment means, it is advantageous (depending on the application area) to leave a free area and to arrange the protective sheath with a gap from the casing.

Figure 2:
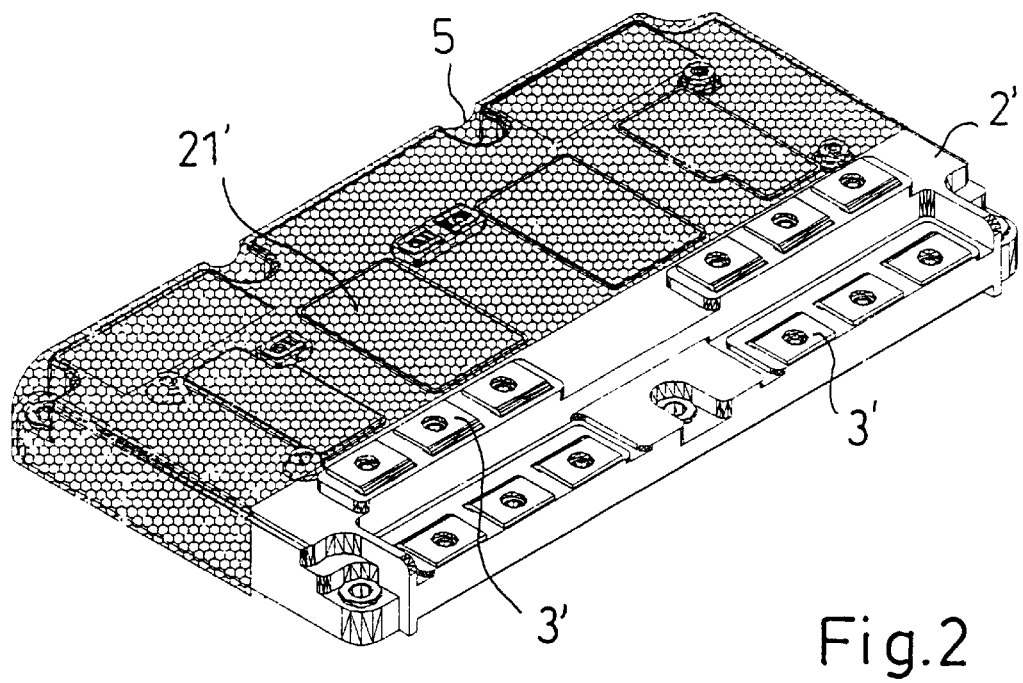
FIG. 2 shows a perspective illustration of a second embodiment.

FIG. 2 illustrates a second embodiment of a semiconductor module which is known per se and is provided with an explosion protection element according to the invention. This comprises a plurality of submodules having semiconductor elements which are arranged on a common baseplate, which cannot be seen here. A casing 2' made of plastic or some other suitable material is fitted onto or above this baseplate. The casing 2' has at least one window 21', and preferably a number of such windows, which allow access to the submodules during manufacture, and which are subsequently preferably filled with a potting compound. Connections 3' project out of the casing 2' in order to produce electrical connections.

As can be seen in FIG. 2, the casing 2' and the baseplate are partially surrounded by a protective sheath 5 of the type described above, with the region of the connections not being affected. It would also be possible to surround the entire casing including the baseplate with such a protective sheath 5 and, once again, to leave recesses for the connections free, or to provide them subsequently. However, in the case of this specific module, it has been found that at least the windows 21' should be covered by the protective sheath 5, in order to ensure efficient explosion protection.

Figure 3:
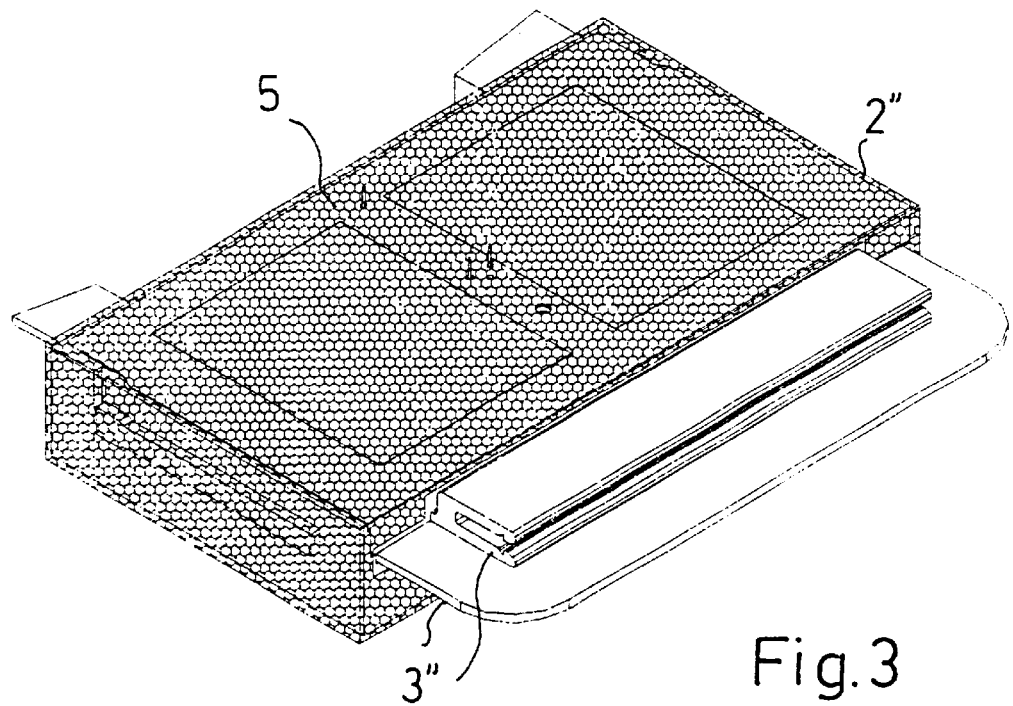
FIG. 3 shows a perspective illustration of a third embodiment.

FIG. 3 illustrates a third embodiment of a semiconductor module which is known per se. In this case, the entire module is surrounded by a casing 2", preferably made of plastic, with connections 3" projecting out of the casing from side end faces. The entire casing 2" is surrounded by a protective sheath 5 of the type described above, with the protective sheath 5 once again making, preferably elastic, contact in this case. Only the connections 3" as well as other projecting parts are free of the protective sheath 5.

In the embodiments illustrated here, each module is in each case provided with its own protective sheath. In the case of stackable high-power semiconductor modules, in particular so-called hockey-puck modules with a round cross section, a single protective sheath may, however, be used for a plurality of modules, by fitting the protective sheath over the modules which are stacked one above the other.

Obviously, numerous modifications and variations of the present invention are possible in light of the above teachings. It is therefore to be understood that, within the scope of the appended claims, the invention may be practiced otherwise than as specifically described herein.

What is claimed is:

1. A high-power semiconductor module, comprising:
  a casing which surrounds at least one semiconductor element, said casing having an explosion protection element for protection against fragments projected outward in the event of an explosion of said semiconductor module, wherein said explosion protection element comprises a protective flexible tube-shaped sheath made from fabric for trapping said fragments, said sheath surrounding at least a portion of said casing and comprising an expandable material.

2. The high-power semiconductor module according to claim 1, wherein said protective sheath elastically rests against said casing.

3. The high-power semiconductor module according to claim 1, which comprises two electrode plates wherein said casing is positioned between said two electrode plates, said protective sheath being attached to at least one of said electrode plates.

4. The high-power semiconductor module according to claim 3, wherein said protective sheath surrounds said casing and forms a gap there between.

5. The high-power semiconductor module according to claim 1, wherein said protective sheath is made of one piece.

6. The high-power semiconductor module according to claim 1, wherein said protective sheath comprises aramid fibers made of para-phenylen-terephthalamide (PPTA).

7. The high-power semiconductor module assembly comprising:
   a plurality of modules which are stacked one above the other and are surrounded by a common protective sheath wherein at least one of said modules comprises a casing which surrounds at least one semiconductor element for protection against fragments projected outward in the event of an explosion of said module, wherein said explosion protection element comprises a protective flexible tube-shaped sheath made from fabric for trapping said fragments, said sheath surrounding at least a portion of said casing and comprising an expandable material.

8. A high-power semiconductor module comprising:
   a casing which surrounds at least one semiconductor element, said casing having an explosion protection means for protection against fragments projected outward in the event of an explosion of said module, wherein said explosion protection means comprises a protective flexible tube-shaped sheath made from fabric for trapping said fragments, said sheath surrounding at least a portion of said casing and comprising an expandable material.

9. The high-power semiconductor module according to claim 8, wherein said protective sheath elastically rests against said casing.

10. The high-power semiconductor module according to claim 8, which comprises two electrode plates wherein said casing is positioned between said two electrode plates, said protective sheath being attached to at least one of said electrode plates.

11. The high-power semiconductor module according to claim 10, wherein said protective sheath surrounds said casing and forms a gap there between.

12. The high-power semiconductor module according to claim 8, wherein said protective sheath comprises an integrally formed sheath.

13. The high-power semiconductor module according to claim 8, wherein said protective sheath comprises Kevlar.

14. The high-power semiconductor module assembly comprising:
   a plurality of modules which are stacked one above the other and are surrounded by a common protective sheath wherein at least one of said modules comprises a casing which surrounds at least one semiconductor element for protection against fragments projected outward in the event of an explosion of said module, wherein said explosion protection means comprises a protective flexible tube-shaped sheath made from fabric for trapping said fragments, said sheath surrounding at least a portion of said casing and comprising an expandable material.

* * * * *